United States Patent
Keller (10) Patent No.: US 11,079,220 B1
(45) Date of Patent: Aug. 3, 2021

(54) CALIBRATION OF AZIMUTH ANGLE FOR OPTICAL METROLOGY STAGE USING GRATING-COUPLED SURFACE PLASMON RESONANCE

(71) Applicant: Onto Innovation Inc., Wilmington, MA (US)

(72) Inventor: Nicholas James Keller, La Jolla, CA (US)

(73) Assignee: ONTO INNOVATION INC., Wilmington, MA (US)

( * ) Notice: Subject to any disclaimer, the term of this patent is extended or adjusted under 35 U.S.C. 154(b) by 0 days.

(21) Appl. No.: 17/018,726

(22) Filed: Sep. 11, 2020

(51) Int. Cl.
*G01B 11/26* (2006.01)
*G01N 21/17* (2006.01)
(Continued)

(52) U.S. Cl.
CPC ............. *G01B 11/26* (2013.01); *G01N 21/17* (2013.01); *G01N 21/211* (2013.01); *G01N 21/47* (2013.01);
(Continued)

(58) Field of Classification Search
CPC ........ G01J 4/00; G01J 4/02; G01J 4/04; G01J 2004/001; G01J 2004/002; G01J 2004/004; G01J 2004/005; G01J 2004/007; G01J 3/18; G01J 3/1804; G01J 3/1809; G01B 11/26; G01B 11/27; G01B 11/272; G03F 7/70608; G03F 7/70616; G03F 7/70625;
(Continued)

(56) References Cited

U.S. PATENT DOCUMENTS 7,224,471 B2 * 5/2007 Bischoff .............. G01N 21/956
356/364
7,463,369 B2 * 12/2008 Wack ..................... G01B 11/24
356/364
(Continued)

OTHER PUBLICATIONS

Hu, Changkui et al., "High-performance Grating Coupled Surface Plasmon Resonance Sensor Based on Al—Au Bimetallic Layer," Modern Applied Science, vol. 4, No. 6, Jun. 2010, www.ccsenet.org/mas.
(Continued)

*Primary Examiner* — Gordon J Stock, Jr.
(74) *Attorney, Agent, or Firm* — Paradice and Li LLP (57) ABSTRACT

Grating-coupled surface plasmon resonance response of a calibration grating is used to calibrate the azimuth angle offset between a sample on the stage and the plane of incidence (POI) of the optical system of an optical metrology device. The calibration grating is configured to produce grating-coupled surface plasmon resonance in response to the optical characteristics of the optical metrology device. The calibration grating is coupled to the stage and positioned at a known azimuth angle with respect to the optical channel of the optical metrology device while the grating-coupled surface plasmon resonance response of the calibration grating is measured. The azimuth angle between an orientation of the calibration grating and the POI of the optical system is determined based on the grating-coupled surface plasmon resonance response. The determined azimuth angle may then be used to correct for an azimuth angle offset between the sample and the POI.

20 Claims, 8 Drawing Sheets

(51) Int. Cl.
*G03F 7/20* (2006.01)
*G01N 21/47* (2006.01)
*G01N 21/21* (2006.01)
*G01N 21/55* (2014.01)
*G01N 21/552* (2014.01)

(52) U.S. Cl.
CPC ......... *G01N 21/4788* (2013.01); *G01N 21/55* (2013.01); *G01N 21/553* (2013.01); *G03F 7/70608* (2013.01); *G01N 2021/213* (2013.01)

(58) Field of Classification Search
CPC ............ G03F 7/70633; G03F 7/70641; G03F 7/7065; G01N 21/17; G01N 21/21; G01N 21/211; G01N 21/25; G01N 21/27; G01N 21/47; G01N 21/4788; G01N 21/55; G01N 21/552; G01N 21/553; G01N 21/554; G01N 21/9501; G01N 2021/212; G01N 2021/213; G01N 2021/214; G01N 2021/215; G01N 2021/217; G01N 2021/258; G01N 2021/4702; G01N 2021/4704; G01N 2021/4707; G01N 2021/4711; G01N 2021/4714; G01N 2021/4792; G01N 2021/555; G01N 2021/556
See application file for complete search history.

(56) References Cited

U.S. PATENT DOCUMENTS

| | | | | |
|---|---|---|---|---|
| 8,027,037 | B2 * | 9/2011 | Littau | G01B 11/0616 356/388 |
| 8,040,511 | B1 | 10/2011 | Krishnan et al. | |
| 8,436,995 | B2 | 5/2013 | Hooper et al. | |
| 9,110,021 | B2 | 8/2015 | Romanato et al. | |
| 9,470,629 | B2 * | 10/2016 | Somekh | G01N 21/55 |
| 9,470,639 | B1 * | 10/2016 | Zhuang | G01B 11/0641 |
| 9,879,977 | B2 * | 1/2018 | Shchegrov | G01B 11/065 |
| 9,995,689 | B2 * | 6/2018 | Vagos | G01N 21/211 |
| 10,296,554 | B2 | 5/2019 | Vagos et al. | |
| 10,502,692 | B2 * | 12/2019 | Cao | G03F 7/70625 |
| 10,621,264 | B2 * | 4/2020 | Vagos | G03F 7/70516 |
| 10,883,924 | B2 * | 1/2021 | O'Mullane | G01B 11/02 |
| 2007/0263219 | A1 * | 11/2007 | De Martino | G01B 11/0641 356/364 |
| 2014/0358485 | A1 * | 12/2014 | Lee | G03F 7/70625 702/189 |
| 2015/0124254 | A1 | 5/2015 | Page et al. | |
| 2016/0334326 | A1 * | 11/2016 | Sapiens | G01B 11/24 |
| 2018/0073987 | A1 | 3/2018 | Chang-Hasnain et al. | |
| 2019/0272305 | A1 | 9/2019 | Vagos et al. | |

OTHER PUBLICATIONS

Ruffato, G. et al., "Innovative Exploitation of Grating-Coupled Surface Plasmon Resonance for Sensing," IntechOpen, Chapter 17, Plasmonics—Principles and Applications, 2012, pp. 419-444.

Seo, Minseok et al., "Grating-coupled surface plasmon resonance on bulk stainless steel," Optics Express 26939, Vo. 25, No. 22, Oct. 30, 2017.

Rossi, Stefano et al., "Grating-Coupled Surface Plasmon Resonance (GC-SPR) Optimization for Phase-Interrogation Biosensing in a Microfluidic Chamber," www.mdpi.com/journal/sensors, Sensors 2018, 18, 1621; doi:10.3390/s18051621.

* cited by examiner

CALIBRATION OF AZIMUTH ANGLE FOR OPTICAL METROLOGY STAGE USING GRATING-COUPLED SURFACE PLASMON RESONANCE

FIELD OF THE DISCLOSURE

Embodiments of the subject matter described herein are related generally to optical metrology equipment, and more particularly to a calibration of the rotational position of an optical metrology stage relative to the optical channel.

BACKGROUND

Semiconductor and other similar industries often use optical metrology equipment to provide non-contact evaluation of substrates during processing. With optical metrology, a sample under test is held on a stage that is used to place the sample at one or more positions with respect to the optical channel for measurement. During measurement, the optical channel is used to illuminate the sample with light, which interacts with the sample. After interacting with the sample, the resulting light is detected and analyzed to determine a desired characteristic of the sample.

During measurement, it is important to not only align the sample position with respect to the optical channel using the stage, but it is also important to know the sample orientation with respect to the optical channel. For example, with knowledge of the sample rotation with respect to the optical channel, the orientation of the sample with respect to the optical channel may be either physically adjusted or the rotation may be included in the analysis of the measurement. If the sample is rotated by an unknown amount with respect to the optical channel, the accuracy of the resulting optical measurements may be adversely affected. Accordingly, proper calibration of the rotational position of the optical metrology stage to the optical channel is desirable.

SUMMARY

The azimuth angle offset between a sample on the stage and the plane of incidence (POI) of the optical system of an optical metrology device using a calibration grating that produces grating-coupled surface plasmon resonance in response to the light used by the optical metrology device. The materials and grating parameters of the calibration grating may be configured to produce grating-coupled surface plasmon resonance in response to the optical characteristics of the optical metrology device, e.g., the specific wavelength(s) and angle of incidence (AOI) of the light used by the optical metrology device. The use of a calibration grating that produces grating-coupled surface plasmon resonance is advantageous for calibration of azimuth angle as it is approximately 2-3× more sensitive to azimuth angle compared to conventional gratings and produces 2× less parametric correlation compared to conventional gratings. The calibration grating may be coupled to the stage and positioned at a known azimuth angle with respect to the optical channel of the optical metrology device while the grating-coupled surface plasmon resonance response of the calibration grating is measured. The azimuth angle between an orientation of the calibration grating and the POI of the optical system may be accurately measured based on the grating-coupled surface plasmon resonance response. The determined azimuth angle may then be used to correct for an azimuth angle offset between the sample and the POI.

In one implementation, an optical metrology device may be calibrated using a calibration grating configured to produce grating-coupled surface plasmon resonance. The optical metrology device, for example, may include an optical system that is configured to produce a beam of light along a plane of incidence (POI) and that includes one or more wavelengths. A stage holds a sample and is coupled to the calibration grating. The calibration grating may be configured to produce grating-coupled surface plasmon resonance at the one or more wavelengths of the beam of light produced by the optical metrology device. A detector detects and generate signals in response to the beam of light interacting with the calibration grating. At least one processor of the optical metrology device receives the signals from the detector and is configured measure the grating-coupled surface plasmon resonance produced by the calibration grating. The at least one processor is configured to determine an azimuth angle between an orientation of the calibration grating and the POI of the optical system based on the grating-coupled surface plasmon resonance produced by the calibration grating. The at least one processor is configured to correct for an azimuth angle offset between the sample on the stage and the POI of the optical system using the determined azimuth angle between the orientation of the calibration grating and the POI of the optical system.

In one implementation, a method of calibrating an optical metrology device, includes measuring a grating-coupled surface plasmon resonance response of a calibration grating that is coupled to a stage, the grating-coupled surface plasmon resonance response is produced in response to a beam of light from an optical system along a plane of incidence (POI) that is incident on the calibration grating. The method further includes determining an azimuth angle between an orientation of the calibration grating and the POI of the optical system based on the grating-coupled surface plasmon resonance response of the calibration grating. The method further includes correcting for an azimuth angle offset between a sample on the stage and the POI of the optical system using the determined azimuth angle between the orientation of the calibration grating and the POI of the optical system.

In one implementation, an optical metrology device may be configured for calibration using grating-coupled surface plasmon resonance. The optical metrology device, for example, may include a means for producing grating-coupled surface plasmon resonance in response to a beam of light from an optical system along a plane of incidence (POI). The optical metrology device further includes a means for measuring a grating-coupled surface plasmon resonance response to the beam of light with respect to the stage and a means for determining an azimuth angle between the stage and the POI of the optical system based on the grating-coupled surface plasmon resonance response. The optical metrology device further includes a means for correcting an azimuth angle offset between a sample on the stage and the POI of the optical system using a determined azimuth angle between the stage and the POI of the optical system.

DETAILED DESCRIPTION

In order to produce an accurate optical measurement of a sample under test, the stage must position the sample at the proper position with respect to the optical channel, otherwise an incorrect portion of the sample may be measured. Additionally, for an accurate optical measurement, the orientation of the sample with respect to the optical channel should be known. For example, a rotation of the sample with respect to the optical channel may affect how the sample affects the light, and thus, may affect the resulting light detected by the optical metrology system. Without an accurate understanding of the orientation of the sample with respect to the optical channel, the resulting measurements may be adversely affected.

For example, optical metrology devices may carefully control the polarization state of the incident light in the optical channel. The alteration of the polarization state of the incident light that is caused by the sample is measured and may be used to determine various characteristics of the sample. If the sample, however, is oriented with respect to the optical channel in a manner that is different than expected, at least a portion of the modification of the polarization state of the light may be due to the orientation of the sample instead of a characteristic of the sample to be determined.

Other types of optical metrology devices may also suffer from measurement inaccuracies if there is not a high degree of accuracy in the alignment of the orientation of the measurement target relative to the optical channel. Scatterometry, for example, has been used extensively for the characterization of critical dimensions (CD) and detailed side-wall profiles of periodic structures in microelectronics fabrication processes. The light scattered by a sample, however, is affected by the orientation of the sample with respect to the incident light. Accordingly, failing to closely control the alignment of the orientation of the measurement target relative to the optical channel may introduce inaccuracies in the measurements.

As discussed herein, the orientation of the sample with respect to the optical channel, referred to herein as azimuth angle, may be precisely measured through the use of a calibration grating that is configured based on the optical channel to produce grating-coupled surface plasmon resonance. Surface plasmon resonance is the resonant oscillation of conduction electrons at the interface between negative and positive permittivity material stimulated by incident light. For example, grating-coupled surface plasmon resonance may be generated in metallic calibration gratings, e.g., gratings that may include one or more of copper, gold, silver, aluminum, tungsten, and a doped semiconductor. One or more parameters of the calibration grating, for example, the pitch, linewidth, or height, may be configured to produce the grating-coupled surface plasmon resonance. The configuration of the calibration grating, e.g., materials and/or grating parameters, may be based on parameters of the optical metrology device, such as specific wavelength(s), and angle of incidence (AOI) of the light used by the optical metrology device. The use of a calibration grating that produces grating-coupled surface plasmon resonance in response to the light used by the optical metrology device is advantageous due to the high sensitivity of the grating-coupled surface plasmon resonance to azimuth angle. For example, a calibration grating configured to produce grating-coupled surface plasmon resonance is approximately 2-3× more sensitive to azimuth angle compared to conventional gratings and produces 2× less parametric correlation compared to conventional gratings.

The calibration grating may be located on the sample itself or otherwise coupled to the stage, e.g., as a reference chip attached to the stage or loaded onto the stage during a calibration procedure before locating the sample under test. The grating-coupled surface plasmon resonance may be measured by the optical metrology device and used to determine the azimuth angle between the calibration grating and the optical channel of the optical metrology device. The azimuth angle for the calibration grating once determined may be used to correct for an azimuth angle offset of the sample during measurement, e.g., by adjusting the position of the sample accordingly, or by including the determined azimuth angle into the measurement determination process.

Figure 1:
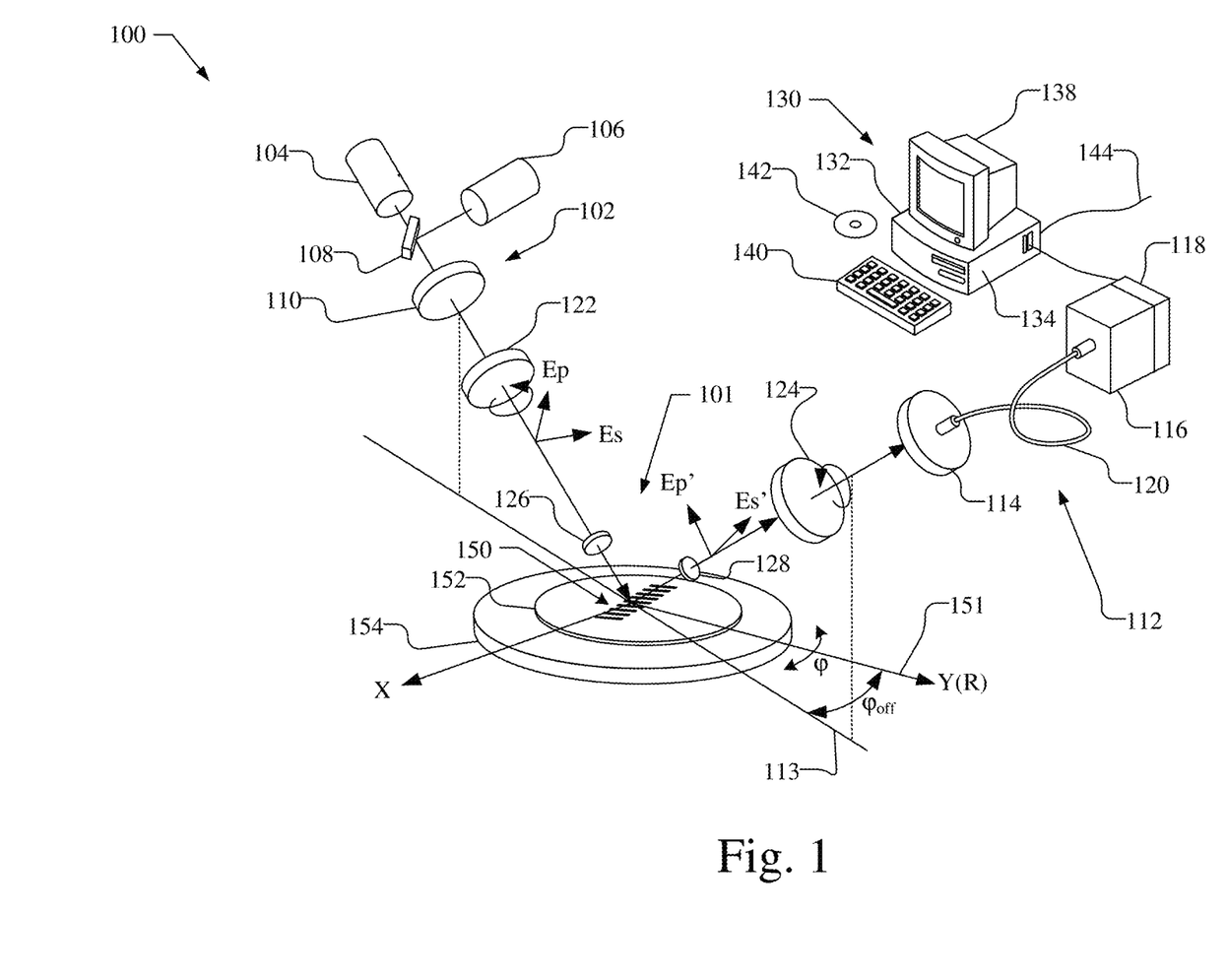
FIG. 1 illustrates an optical metrology device that may use a calibration grating that is configured to produce grating-coupled surface plasmon resonance to calibrate the azimuth angle of the stage with respect to the optical channel of the optical metrology device.

FIG. 1 illustrates an optical metrology device 100 that may use a calibration grating 150 that is configured to produce grating-coupled surface plasmon resonance to calibrate the azimuth angle of the stage with respect to the optical systems 101 of the optical metrology device 100, which is sometimes referred to as an optical channel. The optical metrology device 100 shown in FIG. 1 is illustrated as an ellipsometer for the sake of example. It should be understood, however, that the use of calibration grating 150 is not limited to an ellipsometer and may be used with any optical metrology device where calibration of azimuth angle is desirable, including scatterometers, ellipsometers, polarimeters, and reflectometers or other optical metrology devices, as well as broadband or single wavelength devices.

As illustrated in FIG. 1, the optical channel 101 of the optical metrology device 100 is obliquely incident on the sample 152 and forms a plane-of-incidence (POI) 113, which in general is the plane formed by the incident and specular reflected light from a sample. The orientation of the sample 152, e.g., illustrated by line 151, may be intended to be aligned with the POI 113, but may be inadvertently rotated by an azimuth angle offset $\varphi_{off}$, which is greatly exaggerated in the illustration of FIG. 1. For the sake of simplicity, FIG. 1 illustrates the orientation of the sample 152, e.g., illustrated by line 151, as being aligned with the stage translation direction Y, but in fact, these may differ. The azimuth angle offset $\varphi_{off}$ may be caused from various sources, including rotational offsets produced when loading the sample on the stage 154 and rotational offsets of the stage 154 with respect to the POI 113. The calibration grating 150 may be used to correct azimuth angle offset $\varphi_{off}$ produced by one or more the sources of rotational offsets.

The optical metrology device 100 in FIG. 1 is illustrated as a rotating compensator ellipsometer 100 that performs a diffraction based measurement on the sample 152. The ellipsometer 100 includes a polarization state generator (PSG) 102 and a polarization state detector (PSD) 112. The PSG 102 produces light having a known polarization state and is illustrated as including two broadband light sources 104 and 106 and may produce broadband light, e.g., with a wavelength range of 200-1700 nm. A beam splitter 108 combines the light from the light sources 104, 106 and a polarizer 110 produces the known polarization state. It should be understood that additional, different, or fewer light sources may be used if desired. Moreover, if desired, ellipsometer 100 may be monochromatic, with a variable angle of incidence to provide angle resolved measurements.

The PSD 112 includes a polarizing element, referred to as an analyzer 114, a spectrometer 116 and a detector 118, which may be, e.g., a cooled CCD array. The analyzer 114 is illustrated as being coupled to the spectrometer 116 and detector 118 via a fiber optic cable 120. It should be understood that other arrangements are possible, such as directly illuminating the spectrometer 116 from the analyzer 114 without the fiber optic cable 120.

The ellipsometer 100 is illustrated with two rotating compensators 122 and 124 between the PSG 102 and PSD 112. If desired, the ellipsometer 100 may use a single rotating compensator 122 or 124, e.g., between the PSG 102 and the sample 152 or between the sample 152 and the PSD 112, respectively. The ellipsometer 100 may further include focusing elements 126 and 128 before and after the sample 152. The focusing elements may be, e.g., refractive or reflective lenses.

The ellipsometer 100 obliquely illuminates the sample 152, e.g., at a non-zero value of an angle with respect to surface normal the sample 152. For example, the ellipsometer 100 may illuminate the sample 152 at an angle between 50° to 85°, for example at 65°, but other angles may be used if desired. As discussed above, the angle of incidence may be varied to derive an angle resolved measurement.

The stage 154 may be capable of horizontal motion in either Cartesian coordinates (i.e., X and Y) coordinates, or Polar coordinates (i.e., R and θ) (e.g., where the R coordinates are aligned with the Y coordinates in FIG. 1) or some combination of the two. In some implementations, the optical channel 101 or a portion of the optical channel may move relative to the stage 154. For example, the optical channel may move in the R direction, while the stage 154 moves in the θ direction.

FIG. 1 illustrates a greatly exaggerated azimuth angle offset $\varphi_{off}$ between the POI 113 and the orientation of the sample 152, e.g., illustrated by line 151, which is shown in FIG. 1 as aligned with stage translation direction Y. As discussed above, the ellipsometer 100 may intentionally employ different POI azimuth angles $\varphi$, e.g., by rotating the stage 154 with respect to the optical system.

As further illustrated in FIG. 1, the detector 118 is coupled to a computer 130, which includes a processor 132 with memory 134, as well as a user interface including e.g., a display 138 and input devices 140. A computer-usable storage medium 142 having computer-readable program code embodied may be used by the computer 130 for causing the processor to control the ellipsometer 100 and stage 154 to calibrate the azimuth angle offset $\varphi_{off}$, e.g., to measure the azimuth angle offset $\varphi_{off}$ and to apply an angular correction to the measurement analysis or to adjust the sage 154 accordingly. The non-transitory program code for implementing one or more acts described in this detailed description can be implemented by one of ordinary skill in the art in light of the present disclosure and stored, e.g., on a computer readable storage medium 142, which may be any device or medium that can store code and/or data for use by a computer system such as processor 132. The computer-usable storage medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 2A:
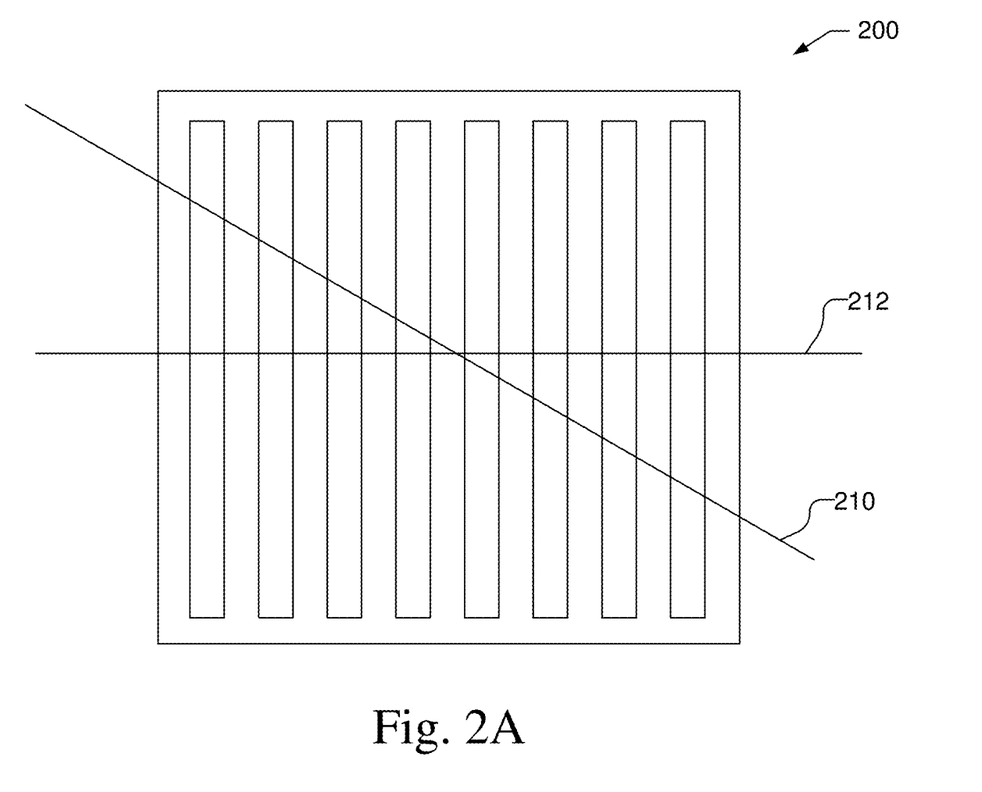
FIGS. 2A and 2B illustrate a top view and a side view, respectively, of a calibration grating that may be used to determine the azimuth angle offset for an optical metrology device based on grating-coupled surface plasmon resonance.
Figure 2B:
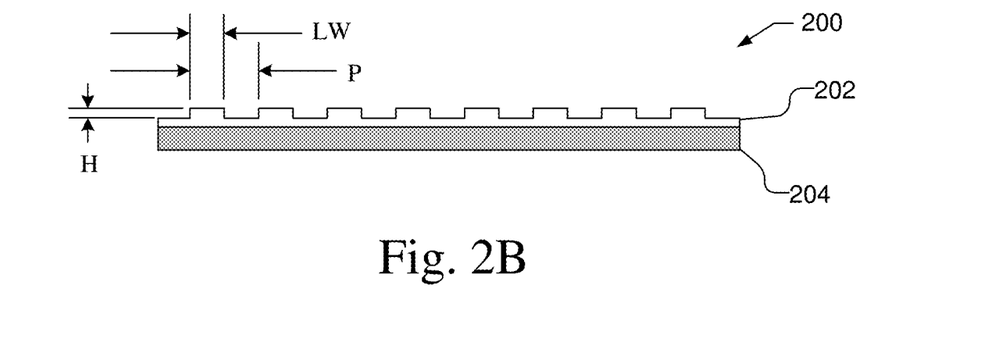

FIGS. 2A and 2B illustrate a top view and a side view of a calibration grating 200 that may be used to determine the azimuth angle offset $\varphi_{off}$ for an optical metrology device, such as optical metrology device 100 shown in FIG. 1, using grating-coupled surface plasmon resonance. The calibration grating 200 may be a metallic grating, e.g., with a pattern metallic film 202 over a substrate 204. The parameters of the calibration grating 200 may be configured based on the optical channel of the optical metrology device to produce grating-coupled surface plasmon resonance. For example, for light used by the optical metrology device is in the visible range, in order to produce grating-coupled surface plasmon resonance, the materials of film 202 for the calibration grating 200 may be selected from one or more of copper, gold, silver, and aluminum. If light used by the optical metrology device is in the infrared range, the materials of the calibration grating 200 may be selected from one or more of tungsten or highly doped semiconductor. A highly doped semiconductor, for example, is doped sufficiently in the IR that the real part of the dielectric function is less than 0, and is therefore able to support plasmonic resonance. Other physical parameters of the calibration grating 200 may additionally be configured based on the optical channel of the optical metrology device in order to produce grating-coupled surface plasmon resonance. For example, to produce grating-coupled surface plasmon resonance, the pitch P of the calibration grating 200 may be on the lower end of the wavelength range of the measurement system, e.g., 500 nm pitch for ultraviolet-visible-near infrared systems and 5-10 μm pitch for mid-infrared systems. Additionally, the line width LW may provide a 1:1 line to space ratio for calibration grating 200. The height H of the lines may be, e.g., 20% of the pitch.

The grating-coupled surface plasmon resonance of the calibration grating 200 is most sensitive to changes in azimuth angle when the incident light is at approximately 20°-30° from perpendicular with respect to the calibration grating 200. Accordingly, during calibration, the calibration grating 200 may be positioned so that the plane of incidence (POI) of the optical metrology device is, e.g., along line 210, which is approximately 20°-30° to the perpendicular 212 of the calibration grating 200.

Figure 3:
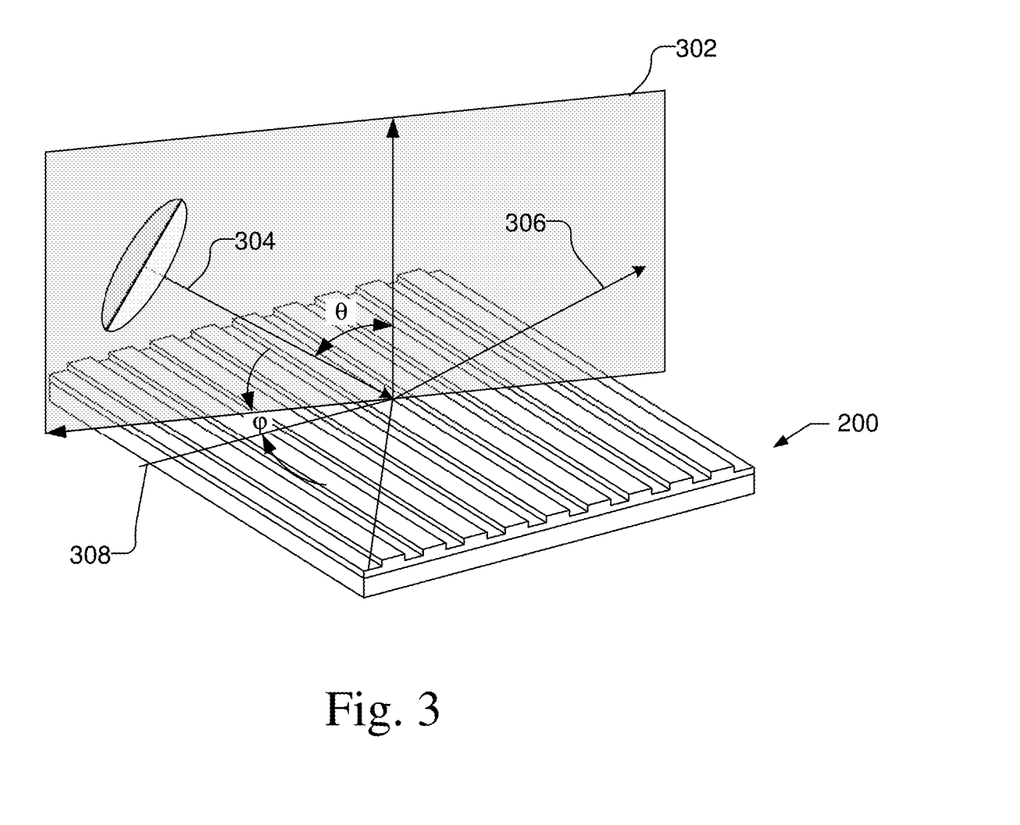
FIG. 3 illustrates a perspective view of a calibration grating and the plane of incidence of an optical metrology device during calibration.

FIG. 3, by way of example, illustrates a perspective view of the calibration grating 200 and the plane of incidence POI 302 of an optical metrology device during calibration. The POI 302 is formed by the incident light 304 and specular reflecting light 306, where the incident light 304 is at an angle θ with respect to normal to the calibration grating 200. The POI 302 is positioned at an angle φ with respect to the perpendicular 308 with respect to the calibration grating 200. The calibration grating 200 may be formed on a sample, e.g., a reference chip mounted to the stage of the optical metrology device, reference sample loaded onto the stage, or the test sample, with the perpendicular 308 of the calibration grating 200 having a well-defined and known orientation with respect to the sample. For example, the perpendicular 308 of the calibration grating 200 may be aligned with a reference direction of the sample. The stage may rotate the sample with the calibration grating 200 by a predetermined amount φ, e.g., 20°-30°, at which the grating-coupled surface plasmon resonance of the calibration grating 200 is most sensitive to variation in azimuth angle.

Figure 4:
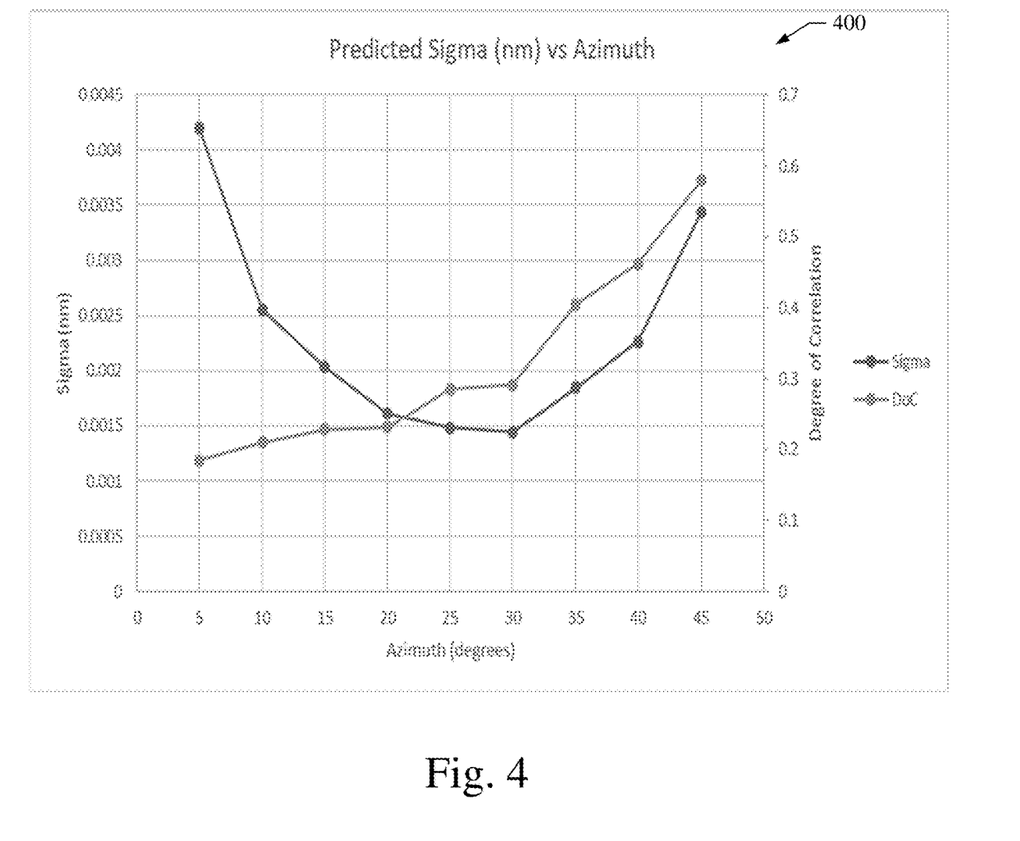
FIG. 4 is a graph of a simulation illustrating the relationship between predicted 1sigma precision and degree of correlation with respect to azimuth angle for specular reflection measurements from a calibration grating that is configured to produce grating-coupled surface plasmon resonance.

FIG. 4 is a graph 400 of a simulation illustrating the relationship between predicted 1sigma precision and degree of correlation with respect to azimuth angle for specular reflection measurements from a calibration grating that is configured to produce grating-coupled surface plasmon resonance. The simulation that produced graph 400 was for a spectroscopic ellipsometer using light with wavelengths from 200 nm-1700 nm at a 65° AOI, and generating measurements at various azimuth angle at 5° increments between 5° to 45° with respect to the perpendicular to the calibration grating. The simulated calibration grating is a metallic grating of copper, with a pitch P of 500 nm, a linewidth LW of 250 nm, and a height H of 100 nm. The predicted 1sigma with respect to azimuth angle, is a measure of the precision or uncertainty of the measurement at that particular azimuth angle, produced using a noise simulator. The degree of correlation with respect to azimuth angle is a measure of how correlated the spectral sensitivity of the azimuth is to other parameters in the structures, such as grating CD and grating height. The higher the degree of correlation, the worse the parameter uncertainty will be. As can be seen in FIG. 4, the 1sigma vs azimuth angle has a minimum at approximately 20° to 30°, while the degree of correlation with respect to azimuth angle increases strongly after 30°. Accordingly, the measurement of the specular reflection from a calibration grating with grating-coupled surface plasmon resonance is illustrated as providing the best response with an azimuth angle of approximately 20° to 30°.

Figure 5:
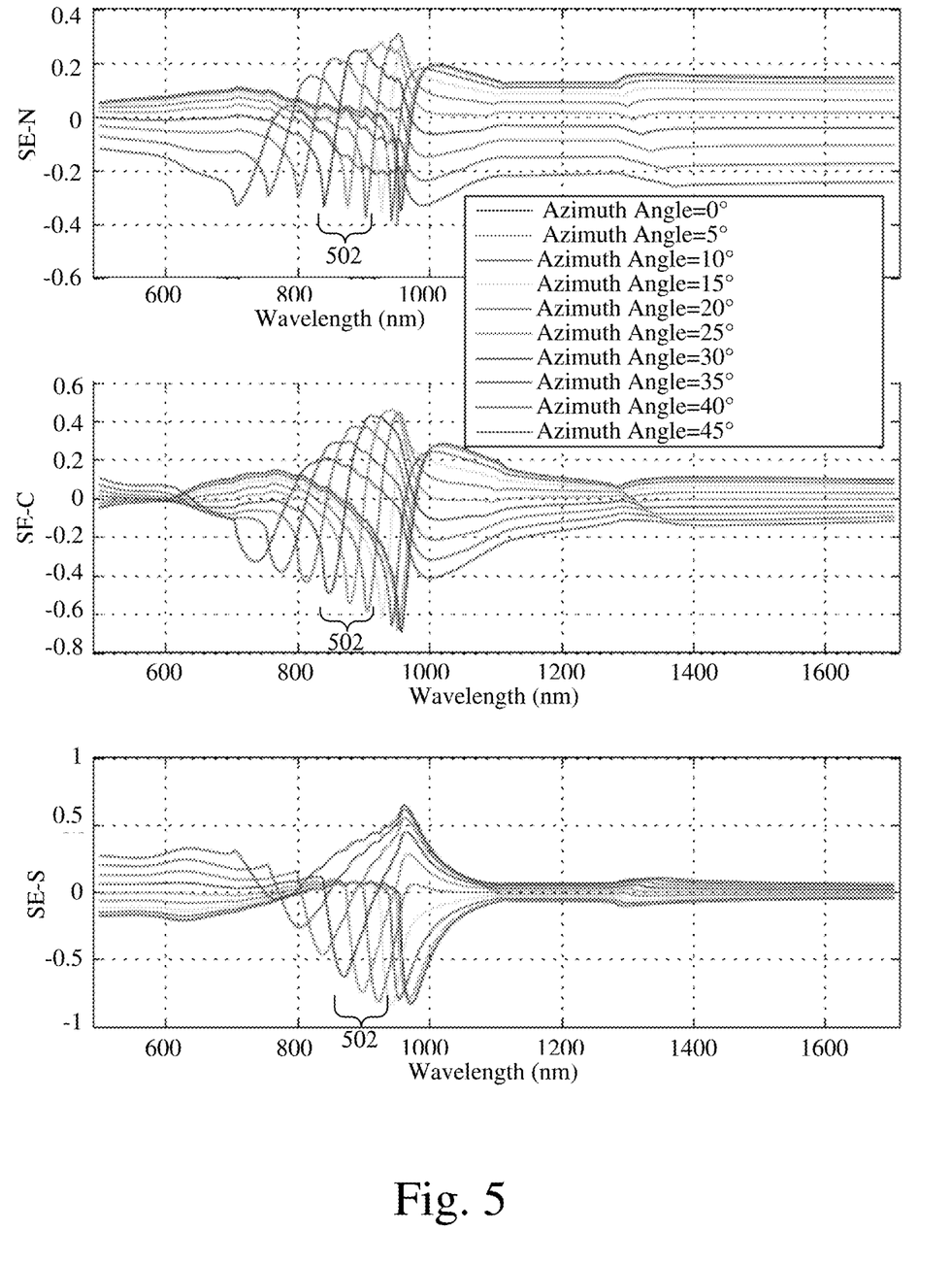
FIG. 5 shows graphs illustrating a simulated grating-coupled surface plasmon resonance response of a calibration grating for spectroscopic ellipsometer parameters N, C, and S over wavelengths from 500 nm-1700 nm at a 65° AOI.

FIG. 5 shows graphs illustrating a simulated grating-coupled surface plasmon resonance response of a calibration grating for spectroscopic ellipsometer parameters N, C, and S over wavelengths from 500 nm-1700 nm at a 65° AOI. The ellipsometer parameters N, C, and S are measured for azimuth angles between 0° to 45° in 5° increments. The calibration grating has the same parameters as used to produce the graph shown in FIG. 4, e.g., a metallic grating of copper with a pitch P of 500 nm, a linewidth LW of 250 nm, and a height H of 100 nm.

The grating-coupled surface plasmon resonance response shown in FIG. 5 illustrates peaks in the spectroscopic ellipsometer parameters N, C, S, between approximately 700 nm to 950 nm. The grating-coupled surface plasmon resonance peaks for azimuth angles 20° to 30° are identified in FIG. 5 with bracket 502. As can be seen, the grating-coupled surface plasmon resonance response for the calibration grating produces a distinct peak at different wavelengths for each azimuth angle. For example, the SE parameter S, has three distinct peaks at azimuth angles 20°, 25° 30°, (identified by bracket 502) at wavelengths 920 nm, 900 nm, and 870 nm, respectively.

Figure 6:
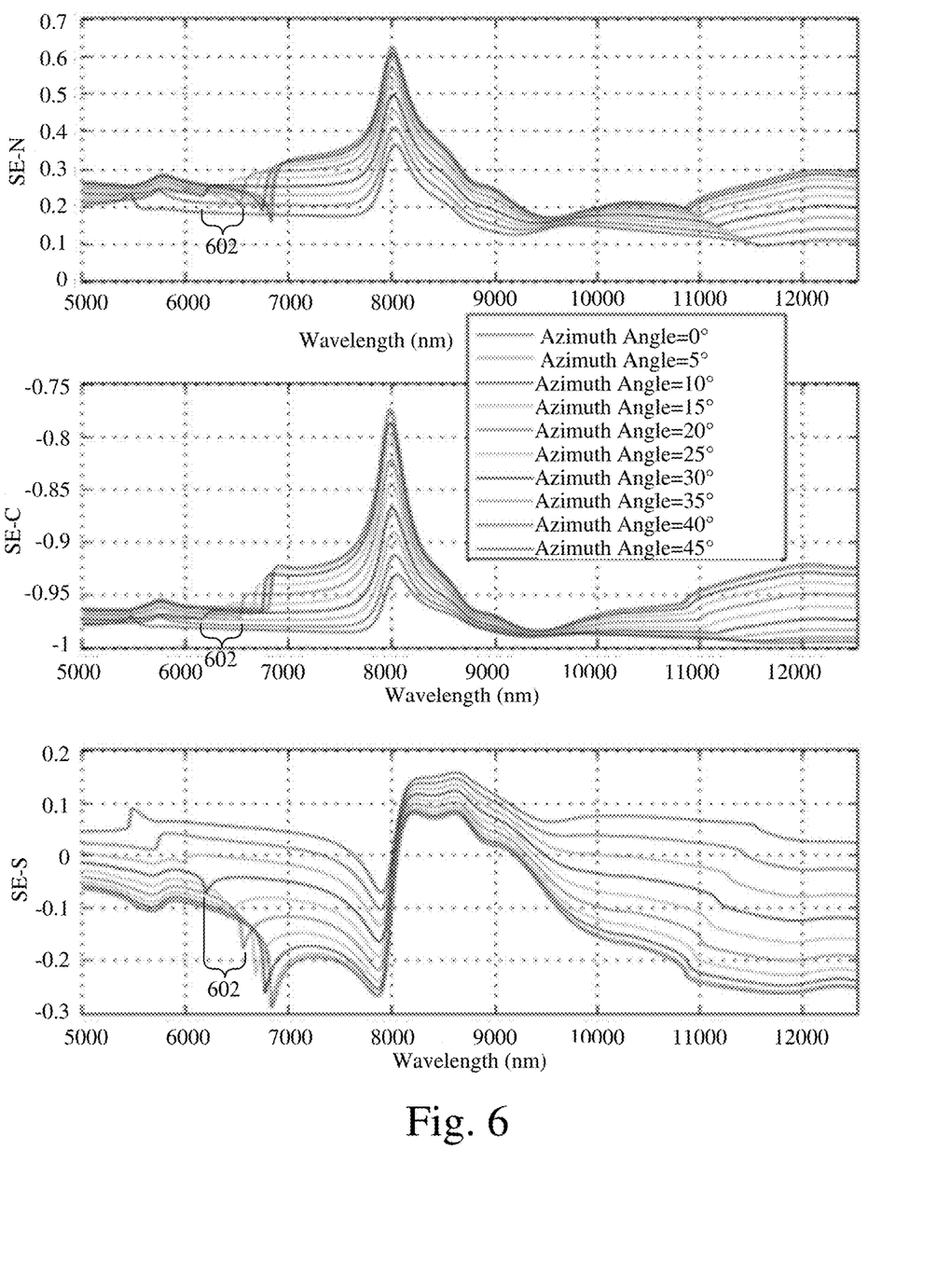
FIG. 6 shows graphs illustrating a simulated grating-coupled surface plasmon resonance response of a calibration grating for spectroscopic ellipsometer parameters N, C, and S for infrared wavelengths from 5000 nm-12000 nm at a 65° AOI.

FIG. 6 shows graphs illustrating a simulated grating-coupled surface plasmon resonance response of a calibration grating for spectroscopic ellipsometer parameters N, C, and S for infrared wavelengths from 5000 nm-12000 nm at a 65° AOI. Similar to FIG. 5, the ellipsometer parameters N, C, and S are measured for azimuth angles between 0° to 45° in 5° increments. The calibration grating used for the simulation shown in FIG. 6 is configured to a produce grating-coupled surface plasmon resonance response based on the simulated wavelengths. The calibration grating, for example, used to produce the graph shown in FIG. 6 may be a metallic grating of copper with a pitch P of 4 μm, a linewidth LW of 2 μm, and a height H of 1 μm.

The grating-coupled surface plasmon resonance response shown in FIG. 6 illustrates peaks in the spectroscopic ellipsometer parameters N, C, S, between approximately 5500 nm to 6900 nm. The grating-coupled surface plasmon resonance peaks for azimuth angles 20° to 30° are identified in FIG. 6 with bracket 602. As can be seen, the grating-coupled surface plasmon resonance response for the calibration grating produces a distinct peak at different wavelengths for each azimuth angle. For example, the SE parameter S, has three distinct peaks at azimuth angles 20°, 25° 30°, (identified by bracket 602) at wavelengths 6600 nm, 6400 nm, and 6200 nm, respectively. Thus, as illustrated in FIG. 6, the grating-coupled surface plasmon resonance response from a calibration grating may be used identified and used to calibrate azimuth angles in both visible and infrared.

Figure 7:
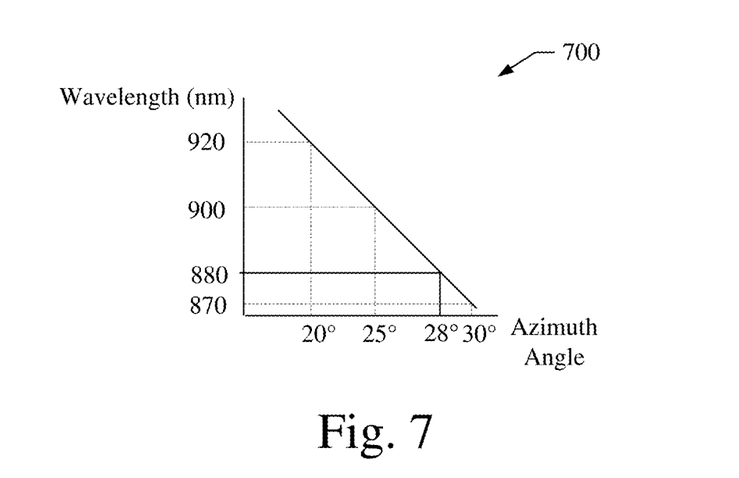
FIG. 7 illustrates a model for the grating-coupled surface plasmon resonance response from the calibration grating that distinct peaks between azimuth angles 20°, 25°, and 30°, for the SE parameter S illustrated in FIG. 5.

In operation, a model may be produced for the grating-coupled surface plasmon resonance response from a calibration grating at a plurality of azimuth angles. For example, FIG. 7 illustrates a model 700 for the grating-coupled surface plasmon resonance response from the calibration grating that distinct peaks between azimuth angles 20°, 25°, and 30°, for the SE parameter S illustrated in FIG. 5. The model 700, for example, correlates the grating-coupled surface plasmon resonance peak wavelengths to azimuth angle. Additional azimuth angles between 20°-30°, e.g., at every 1°, or less may be modeled or measured for a calibration grating. The grating-coupled surface plasmon resonance response between peaks may be interpolated. The model 700 for the calibration grating may be stored in an optical metrology device, such as in memory 134 the computer-usable storage medium 142 in the computer 130 associated with the optical metrology device 100 shown in FIG. 1. The model 700, for example, may be stored as a look up table or an equation that describes the data, e.g., describes the resulting grating-coupled surface plasmon resonance peaks with respect to azimuth angle. For example, for the data illustrated in FIG. 5, the model may correlate the wavelengths of the grating-coupled surface plasmon resonance peaks to azimuth angle. While other structural parameters may cause the resonance features to move, the model may be designed to balance the azimuth sensitivity and the parameter correlation, e.g., based on the degree of correlation plot.

Figure 8:
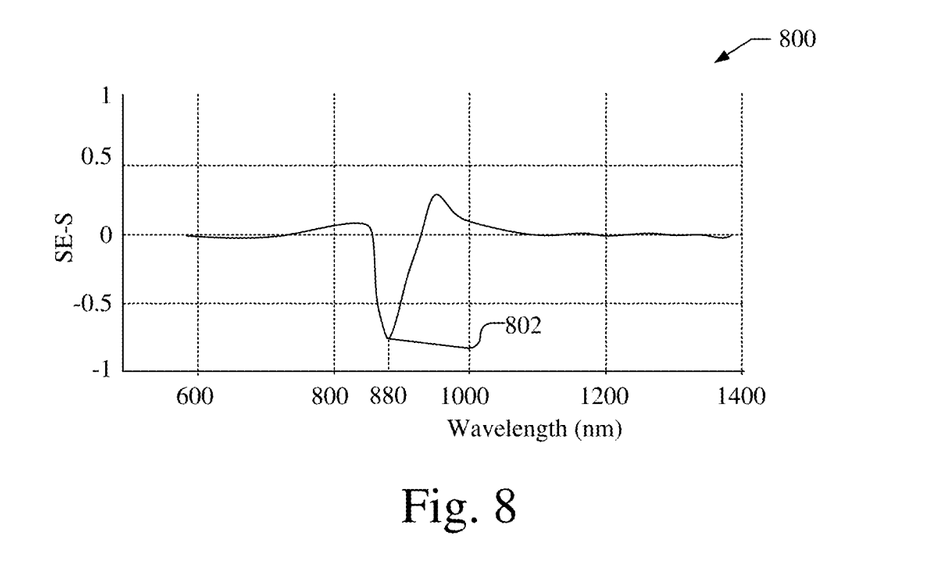
FIG. 8 illustrates a simulation of a grating-coupled surface plasmon resonance response of a calibration grating for spectroscopic ellipsometer parameter SE-S over wavelengths from 600 nm-1400 nm at a 65° AOI.

The stage 154 may be controlled to rotate to place the calibration grating 150 at an intended azimuth angle with respect to the POI 113, e.g., intended azimuth angle 25°. The calibration grating 150, for example, may be on the sample (wafer) under test, on a reference sample (wafer), or a reference chip connected to the stage 154. The optical metrology device 100 measures the calibration grating 150. FIG. 8, by way of example, illustrates a simulation of a grating-coupled surface plasmon resonance response 800 of a calibration grating for spectroscopic ellipsometer parameter SE-S over wavelengths from 600 nm-1400 nm at a 65° AOI. The measured grating-coupled surface plasmon resonance response 800 produced by the calibration grating may then be compared to the model 700, shown in FIG. 7, to determine the actual azimuth angle of the calibration grating. For example, as illustrated in FIG. 8, the wavelength of the grating-coupled surface plasmon resonance response peak 802 is at approximately 880 nm. As illustrated in the example model 700 in FIG. 7, a peak wavelength of 88 nm corresponds to an azimuth angle of 28°. Thus, based on the grating-coupled surface plasmon resonance response 800 of the calibration grating and the model 700, the actual azimuth angle of the stage 154 is determined to be 28°. Thus, there is an azimuthal error of 3°, e.g., when the stage 154 is controlled to produce an azimuth angle of X°, it will produce an actual azimuthal angle of X°+3°.

The calibration data, i.e., the determined actual azimuth angle, may then be used to correct for azimuthal angle offset between a sample and the POI 113 of the optical metrology device 100 during measurements of the sample. For example, during measurement of the sample, the stage 154 may be controlled to rotate compensate for the azimuthal error determined during calibration. Based on the above example, for example, where measurement of the calibration grating indicated an error of 3°, the stage 154 may adjust the amount it rotates by −3° to compensate for the 3° azimuthal error, i.e., if the stage 154 is to rotate by 40° for a measurement of the sample, the stage 154 is controlled to rotate 37°. Alternatively, the azimuthal angle of a measurement target may be corrected by accounting for the azimuthal angle offset during the measurement analysis. For example, if measurement data is acquired with the stage at 40°, during analysis of the measurement data, the azimuth angle is treated as 43°.

Figure 9:
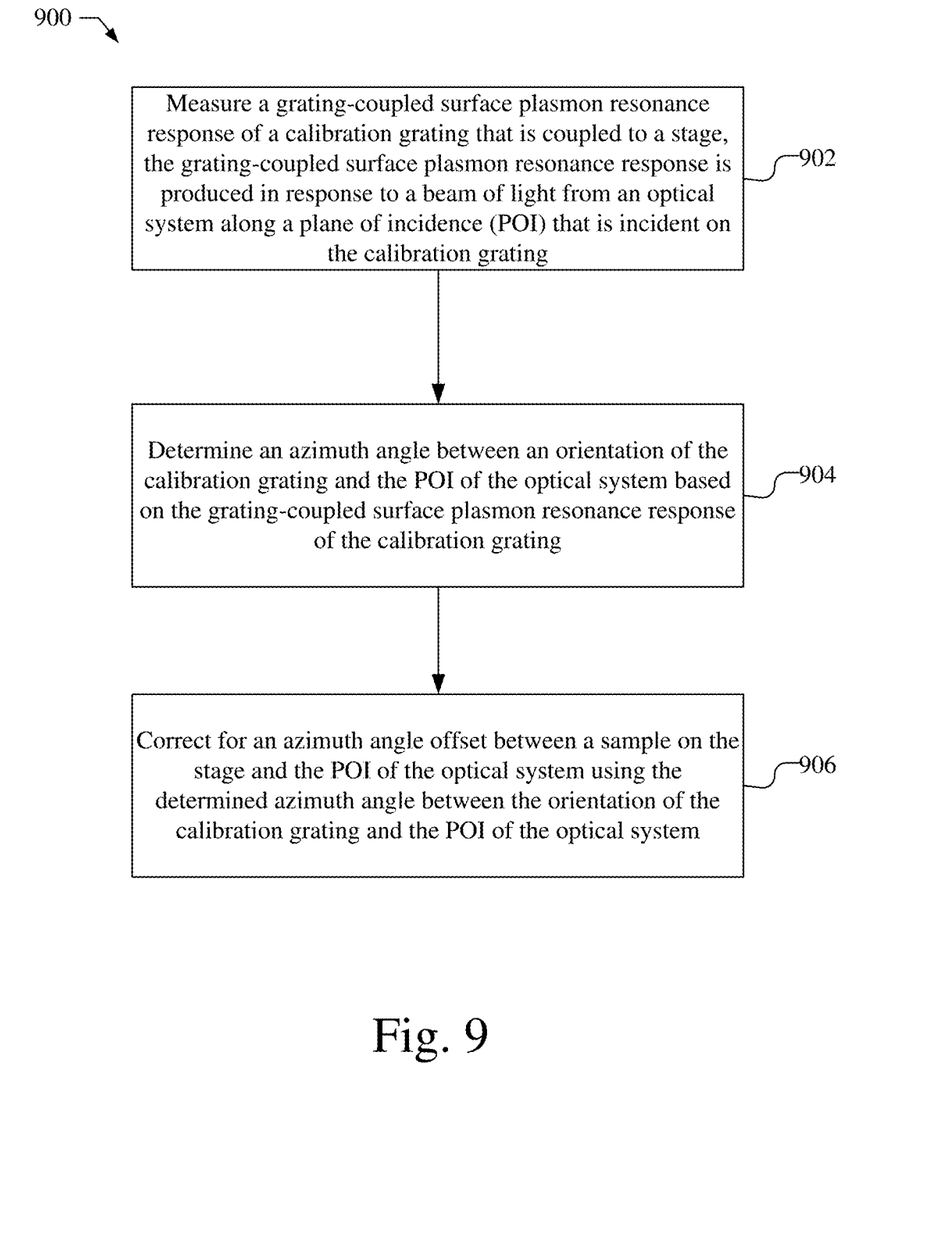
FIG. 9 is a flow chart illustrating a method of calibrating an optical metrology device using a calibration grating configured to produce a grating-coupled surface plasmon resonance response.

FIG. 9 is a flow chart 900 illustrating a method of calibrating an optical metrology device, e.g., using a calibration grating configured to produce a grating-coupled surface plasmon resonance response. The optical metrology device may be, e.g., an ellipsometer, a spectroscopic ellipsometer, a scatterometer, a polarimeter, or a reflectometer.

As illustrated at block 902, a grating-coupled surface plasmon resonance response of a calibration grating that is coupled to a stage is measured, the grating-coupled surface plasmon resonance response is produced in response to a beam of light from an optical system along a plane of incidence (POI) that is incident on the calibration grating. The calibration grating, for example, may be a metallic grating. In some implementations, the calibration grating may include one or more of copper, gold, silver, aluminum, tungsten, and a doped semiconductor. In some implementations, the calibration grating may be on the sample. In some implementations, the calibration grating may be on a reference chip attached to the stage. A means for measuring a grating-coupled surface plasmon resonance response of a calibration grating that is coupled to a stage, the grating-coupled surface plasmon resonance response is produced in response to a beam of light from an optical system along a plane of incidence (POI) that is incident on the calibration grating may include, e.g., an optical system 101, a stage 154, a detector 118, and one or more processors 132 with dedicated hardware or implementing executable code or software instructions in memory 134 and/or medium 142 in the optical metrology device 100, shown in FIG. 1.

At block 904, an azimuth angle between an orientation of the calibration grating and the POI of the optical system is determined based on the grating-coupled surface plasmon resonance response of the calibration grating. For example, the azimuth angle may be determined based on a plasmon resonance curve that correlates grating-coupled surface plasmon resonance response to azimuth angles. A means for determining an azimuth angle between an orientation of the calibration grating and the POI of the optical system based on the grating-coupled surface plasmon resonance response of the calibration grating may include, e.g., one or more processors 132 with dedicated hardware or implementing executable code or software instructions in memory 134 and/or medium 142 in the optical metrology device 100, shown in FIG. 1.

At block 906, an azimuth angle offset between a sample on the stage and the POI of the optical system is corrected using the determined azimuth angle between the orientation of the calibration grating and the POI of the optical system. The azimuth angle offset between the sample and the POI of the optical system may be corrected, for example, by altering an orientation of the stage with respect to the POI of the optical system based on the determined azimuth angle or by accounting for the azimuth angle offset during processing of measurement of the sample. A means for correcting for an azimuth angle offset between a sample on the stage and the POI of the optical system using the determined azimuth angle between the orientation of the calibration grating and the POI of the optical system may include, e.g., the stage 154 and one or more processors 132 with dedicated hardware or implementing executable code or software instructions in memory 134 and/or medium 142 in the optical metrology device 100, shown in FIG. 1.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An optical metrology device comprising:
   an optical system configured to produce a beam of light along a plane of incidence (POI), the beam of light comprising one or more wavelengths;
   a stage configured to hold a sample and coupled to a calibration grating, the calibration grating configured to produce grating-coupled surface plasmon resonance at the one or more wavelengths of the beam of light;
   a detector configured to detect and generate signals in response to the beam of light interacting with the calibration grating; and
   at least one processor coupled to receive the signals from the detector, wherein the at least one processor is configured to:
   measure the grating-coupled surface plasmon resonance produced by the calibration grating;

determine an azimuth angle between an orientation of the calibration grating and the POI of the optical system based on the grating-coupled surface plasmon resonance produced by the calibration grating; and correct for an azimuth angle offset between the sample on the stage and the POI of the optical system using the determined azimuth angle between the orientation of the calibration grating and the POI of the optical system.

2. The optical metrology device of claim 1, wherein the calibration grating comprises a metallic grating.

3. The optical metrology device of claim 2, wherein the metallic grating comprises one or more of copper, gold, silver, aluminum, tungsten, and a doped semiconductor.

4. The optical metrology device of claim 1, wherein the one or more wavelengths is in one or more of a visible wavelength range and an infrared wavelength range.

5. The optical metrology device of claim 1, wherein the at least one processor is configured to determine the azimuth angle based on a plasmon resonance curve that correlates grating-coupled surface plasmon resonance measurements to azimuth angles.

6. The optical metrology device of claim 1, wherein the calibration grating is on the sample.

7. The optical metrology device of claim 1, wherein the calibration grating is on a reference chip attached to the stage.

8. The optical metrology device of claim 1, wherein the at least one processor is configured to correct for the azimuth angle offset between the sample and the POI of the optical system by being configured to alter an orientation of the stage with respect to the POI of the optical system based on the determined azimuth angle or to account for the azimuth angle offset during processing of measurement of the sample.

9. The optical metrology device of claim 1, wherein the optical metrology device is one of a member of a group comprising an ellipsometer, a spectroscopic ellipsometer, a scatterometer, a polarimeter, and a reflectometer.

10. A method of calibrating an optical metrology device, comprising:
measuring a grating-coupled surface plasmon resonance response of a calibration grating that is coupled to a stage, the grating-coupled surface plasmon resonance response is produced in response to a beam of light from an optical system along a plane of incidence (POI) that is incident on the calibration grating;

determining an azimuth angle between an orientation of the calibration grating and the POI of the optical system based on the grating-coupled surface plasmon resonance response of the calibration grating; and correcting for an azimuth angle offset between a sample on the stage and the POI of the optical system using the determined azimuth angle between the orientation of the calibration grating and the POI of the optical system.

11. The method of claim 10, wherein the calibration grating comprises a metallic grating.

12. The method of claim 11, wherein the metallic grating comprises one or more of copper, gold, silver, aluminum, tungsten, and a doped semiconductor.

13. The method of claim 10, wherein determining the azimuth angle is based on a plasmon resonance curve that correlates grating-coupled surface plasmon resonance response to azimuth angles.

14. The method of claim 10, wherein the calibration grating is on the sample.

15. The method of claim 10, wherein the calibration grating is on a reference chip attached to the stage.

16. The method of claim 10, wherein correcting for the azimuth angle offset between the sample and the POI of the optical system comprises one of altering an orientation of the stage with respect to the POI of the optical system based on the determined azimuth angle or accounting for the azimuth angle offset during processing of measurement of the sample.

17. The method of claim 10, wherein the optical metrology device is one of a member of a group comprising an ellipsometer, a spectroscopic ellipsometer, a scatterometer, a polarimeter, and a reflectometer.

18. An optical metrology device configured for calibration, comprising:
means for producing grating-coupled surface plasmon resonance in response to a beam of light from an optical system along a plane of incidence (POI);

means for measuring a grating-coupled surface plasmon resonance response to the beam of light with respect to a stage;

means for determining an azimuth angle between the stage and the POI of the optical system based on the grating-coupled surface plasmon resonance response; and means for correcting an azimuth angle offset between a sample on the stage and the POI of the optical system using a determined azimuth angle between the stage and the POI of the optical system.

19. The optical metrology device of claim 18, wherein the means for determining the azimuth angle uses a plasmon resonance curve that correlates grating-coupled surface plasmon resonance response to azimuth angles.

20. The optical metrology device of claim 18, wherein the means for correcting for the azimuth angle offset between the sample on the stage and the POI of the optical system alters an orientation of the stage with respect to the POI of the optical system based on the determined azimuth angle or accounts for the azimuth angle offset during processing of measurement of the sample.

* * * * *